US010334729B2

(12) United States Patent
Dickman et al.

(10) Patent No.: US 10,334,729 B2
(45) Date of Patent: Jun. 25, 2019

(54) WAVEGUIDE RF FILTERING USING RIGID-FLEXIBLE SUBSTRATE

(71) Applicant: Transtector Systems, Inc., Hayden, ID (US)

(72) Inventors: Edward J. Dickman, Post Falls, ID (US); Kelly A. Dane, Athol, ID (US); Randall T. Palmer, Greenacres, WA (US)

(73) Assignee: TRANSTECTOR SYSTEMS, INC., Hayden, ID (US)

( * ) Notice: Subject to any disclaimer, the term of this patent is extended or adjusted under 35 U.S.C. 154(b) by 124 days.

(21) Appl. No.: 15/601,692

(22) Filed: May 22, 2017

(65) Prior Publication Data

US 2018/0337649 A1 Nov. 22, 2018

(51) Int. Cl.
*H05K 1/14* (2006.01)
*H05K 9/00* (2006.01)
*H05K 1/02* (2006.01)

(52) U.S. Cl.
CPC .......... *H05K 1/147* (2013.01); *H05K 1/0245* (2013.01); *H05K 9/006* (2013.01); *H05K 9/0015* (2013.01); *H05K 2201/1003* (2013.01); *H05K 2201/10015* (2013.01); *H05K 2201/10022* (2013.01); *H05K 2201/10174* (2013.01)

(58) Field of Classification Search
CPC ...... H03H 1/0007; H05K 9/0015; H05K 5/03; H05K 1/147; H05K 5/0065; H05K 1/0245; H05K 2201/1003; H05K 2201/10015; H05K 2201/10022; H05K 2201/10174; H05K 9/006
USPC ..... 333/24 R, 236, 238, 239, 245, 246, 248, 333/249; 361/789
See application file for complete search history.

(56) References Cited

U.S. PATENT DOCUMENTS

| 7,369,415 | B2 * | 5/2008 | Kojima | H05K 1/189 |
| | | | | 361/749 |
| 9,190,837 | B2 | 11/2015 | Tollefsbol et al. | |
| 2013/0293997 | A1 * | 11/2013 | Tollefsbol | H02H 9/005 |
| | | | | 361/111 |

* cited by examiner

*Primary Examiner* — Rakesh B Patel
*Assistant Examiner* — Jorge L Salazar, Jr.
(74) *Attorney, Agent, or Firm* — Snell & Wilmer LLP

(57) ABSTRACT

A filtering unit includes a housing having outer walls that define a volume and an inner wall that separates the volume into a first chamber and a second chamber. The filtering unit also includes a rigid/flexible circuit board. The circuit board includes a first rigid portion designed to be positioned in the first chamber. The circuit board further includes a second rigid portion designed to be positioned in the second chamber. The circuit board further includes a flexible portion connecting the first rigid portion to the second rigid portion and designed to extend around the inner wall from the first chamber to the second chamber. The filtering unit further includes a bumper designed to be positioned between one of the outer walls and the inner wall to provide waveguide functionality by reducing an amount of electric field that can pass from the first chamber to the second chamber.

19 Claims, 9 Drawing Sheets

WAVEGUIDE RF FILTERING USING RIGID-FLEXIBLE SUBSTRATE

BACKGROUND

1. Field

The invention relates to a filtering unit that utilizes a rigid-flexible substrate with RF filtering components and waveguide construction to reduce undesirable noise on one or more input signal.

2. Description of the Related Art

Communication networks are used in many different situations. For example, a communication network may be used to establish communications between multiple ultra-high frequency (UHF) radios. In particular, a Patriot communication network may be used to establish communications between military personnel located at different locations. Such a communication network may utilize a ground platform to patch various communication lines together based on a received control signal. Due to the sensitive nature of such communications, it may be desirable for the control signal to be received by the ground platform with minimal noise and interference. In that regard, a filtering unit may be used to reduce noise of the control signals prior to receipt of the control signals by the ground platform. It is desirable for the filtering unit to provide relatively high-quality noise reduction of the control signals.

SUMMARY

The above problem is solved using a filtering unit for filtering unwanted signals from a desired signal. The filter design uses a "tortured path" that creates a waveguide below cutoff frequency. The signal conditioning and filtering circuit board includes multiple rigid sections that are coupled together with flexible portions therebetween. The flexible portions snake through walls of a housing that segment an enclosure into increasingly "cleaner" chambers. Optionally, conductive pads and flexible conductive gaskets are incorporated to provide additional EMI shielding within the enclosure, to further isolate each chamber.

Described herein is a filtering unit which includes a housing having outer walls that define a volume and an inner wall that separates the volume into a first chamber and a second chamber. The filtering unit also includes a rigid/flexible circuit board. The rigid/flexible circuit board includes a first rigid portion designed to be positioned in the first chamber. The rigid/flexible circuit board further includes a second rigid portion designed to be positioned in the second chamber. The rigid/flexible circuit board further includes a flexible portion connecting the first rigid portion to the second rigid portion and designed to extend around the inner wall from the first chamber to the second chamber. The filtering unit further includes a bumper designed to be positioned between one of the outer walls and the inner wall in order to reduce a size of a space between the one of the outer walls and the inner wall in order to provide waveguide functionality by reducing an amount of electric field that can pass from the first chamber to the second chamber.

Also described is a filtering unit for filtering unwanted signals from a desired signal. The filtering unit includes a housing having outer walls that define a volume and an inner wall that separates the volume into a first chamber and a second chamber. The filtering unit further includes a rigid/flexible circuit board. The rigid/flexible circuit board includes a ground plane. The rigid/flexible circuit board further includes a first rigid portion designed to be positioned in the first chamber. The rigid/flexible circuit board further includes a second rigid portion designed to be positioned in the second chamber. The rigid/flexible circuit board further includes a flexible portion connecting the first rigid portion to the second rigid portion, having an exposed conductive portion electrically connected to the ground plane, and designed to extend around the inner wall from the first chamber to the second chamber. The filtering unit further includes a conductive bumper designed to be positioned between one of the outer walls and the inner wall and to make contact with the exposed conductive portion of the flexible portion to create an electrical connection between the ground plane and the housing.

Also described is a filtering unit for filtering unwanted signals from a desired signal. The filtering unit includes a housing having outer walls that define a volume and four inner walls that separate the housing into five chambers. The filtering unit further includes a rigid/flexible circuit board. The rigid/flexible circuit board includes at least five rigid portions each designed to be positioned in one of the five chambers. The rigid/flexible circuit board further includes multiple flexible portions each positioned between two of the at least five rigid portions such that at least at least one flexible portion extends around each of the four inner walls. The filtering unit further includes four bumpers each designed to be positioned between one of the outer walls and a corresponding inner wall in order to reduce a size of a space between the one of the outer walls and the corresponding inner wall in order to provide waveguide functionality by progressively reducing an amount of electric field that can pass between each of the five chambers.

BRIEF DESCRIPTION OF THE DRAWINGS

Other systems, methods, features, and advantages of the present invention will be or will become apparent to one with skill in the art upon examination of the following figures and detailed description. It is intended that all such additional systems, methods, features, and advantages be included within this description, be within the scope of the present invention, and be protected by the accompanying claims. Component parts shown in the drawings are not necessarily to scale, and may be exaggerated to better illustrate the important features of the present invention. In the drawings, like reference numerals designate like parts throughout the different views, wherein:

DETAILED DESCRIPTION

Figure 1:
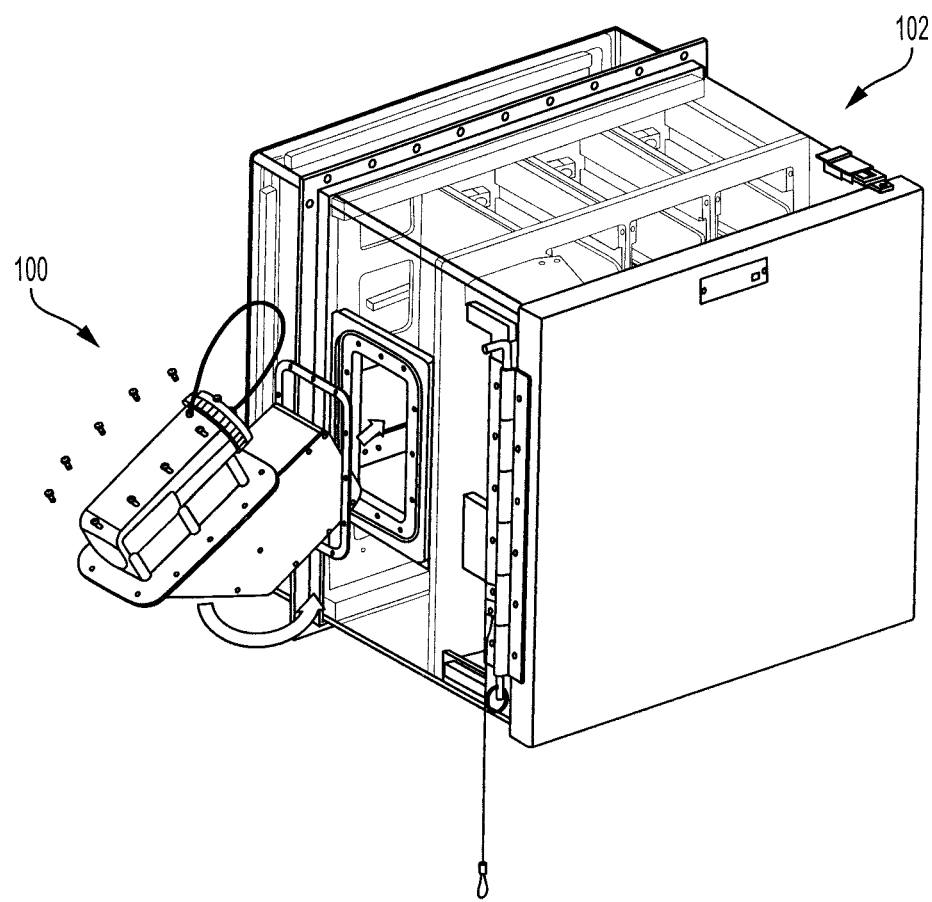
FIG. 1 is a perspective view of a ground platform having a filtering unit for filtering at least one input signal to the ground platform according to an embodiment of the present invention.

Referring to FIG. 1, a filtering unit 100 for use with a ground platform 102 is shown. The ground platform 102 may be used to provide communication capabilities and functionality to various pieces of equipment such as unmanned aerial vehicles. The filtering unit 100 is designed to receive an input signal, filter undesired signals (such as noise) from the input signal, function as a surge protector, and output a clean version of the input signal (i.e., a reduced noise and surge-free version of the input signal). Although the filtering unit 100 is shown for use with the ground platform 102, the features of the filtering unit 100 may be used in any situation in which relatively high quality signal filtering or high energy surge protection is desired.

Figure 2:
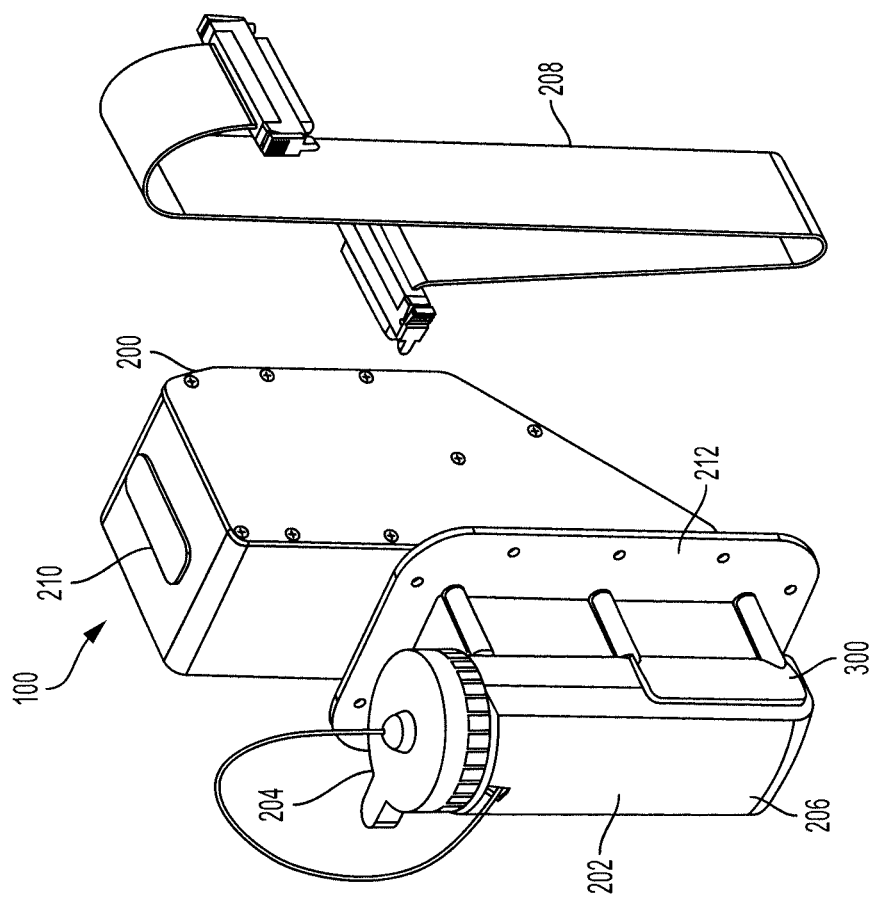
FIG. 2 is a perspective view of the filtering unit of FIG. 1 according to an embodiment of the present invention.

Referring to FIGS. 1 and 2, the filtering unit 100 is designed to be partially positioned within the ground platform 102. In that regard, the filtering unit 100 includes a filtering portion 200 and a pre-filter connection portion 202. The filtering portion 200 is designed to be positioned within the ground platform 102 and the pre-filter connection portion 202 is designed to be positioned outside of the ground platform 102 when the filtering unit 100 is attached to the ground platform 102.

In order to attach the filtering unit 100 to the ground platform 102, a mounting flange 212 of the filtering unit 100 may be fastened to the ground platform 102 via, for example, fasteners. The filtering portion 200 includes various design features and components for filtering the input signal and providing surge protection functionality. Various features of the filtering portion 200 will be described with more detail below.

The pre-filter connection portion 202 is designed to connect to an external device for receiving the input signal. In that regard, the pre-filter connection portion 202 includes a connector casing 300 having a lid 204 and a cover 206. In order to connect the external device to the pre-filter connection portion 202, the lid 204 may be rotated, allowing the cover 206 to be removed from the connector casing 300. An electrical connector to an external device (not shown) is positioned within the connector casing 300 and provides a means for receiving the input signal.

The filtering portion 200 includes an interface 210 designed to receive one end of a cable 208, the other end of which is to be connected to a component (not shown) internal to the ground platform 102. In some embodiments, the interface 210 may be designed to connect to a micro D-sub connector. As shown, the interface is covered with a plug that seals the interface 210 from external conditions and debris, such as during shipping and storage of the filtering portion 200.

Figure 3:
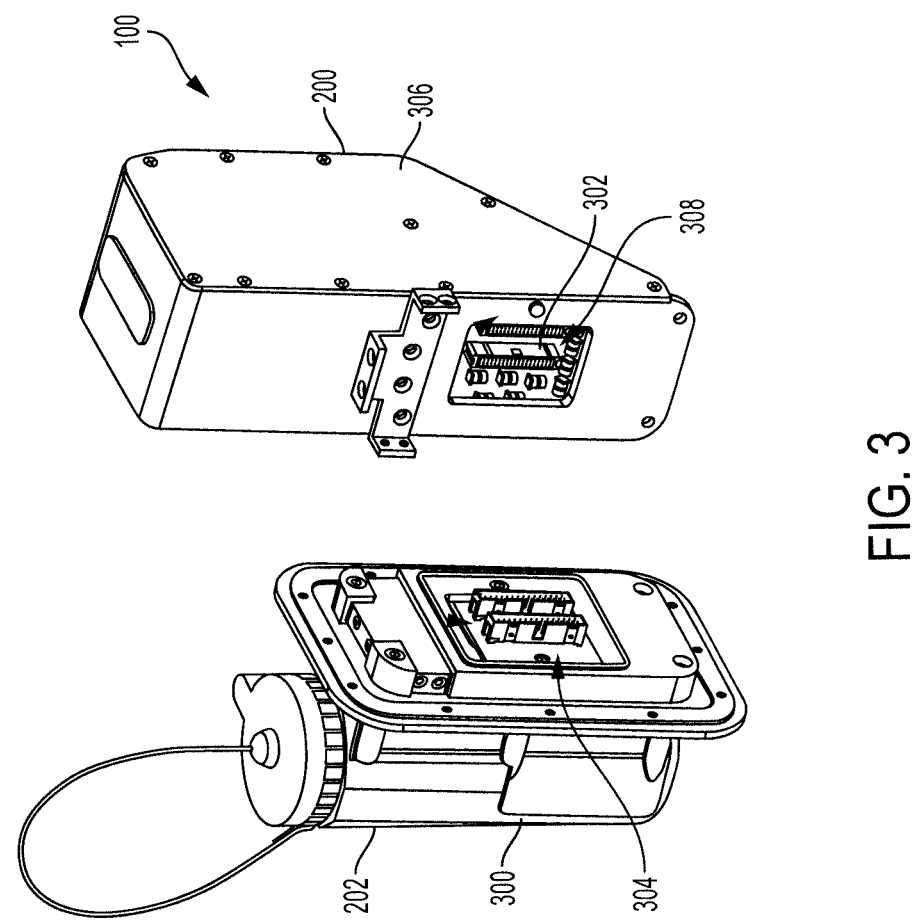
FIG. 3 is a perspective view of the filtering unit of FIG. 1 with a pre-filter connection portion and a filtering portion separated from each other according to an embodiment of the present invention.

Turning now to FIG. 3, the pre-filter connection portion 202 may be fabricated separately from the filtering portion 200 and may be fastened to the filtering portion 200 via fasteners (not shown). In that regard, the filtering portion 200 includes a filtering unit circuit board 302 and the pre-filter connection portion 202 includes a main connector assembly 304 designed to mate with the filtering unit circuit board 302.

The filtering portion 200 may include a housing 306 with a rigid/flexible circuit board 308 positioned therein. The rigid/flexible circuit board 308 may include components and have a physical layout that are each designed to filter the input signal. In that regard, the filtering unit circuit board 302 may be attached to, or integral with, the rigid/flexible circuit board 308.

Figure 4:
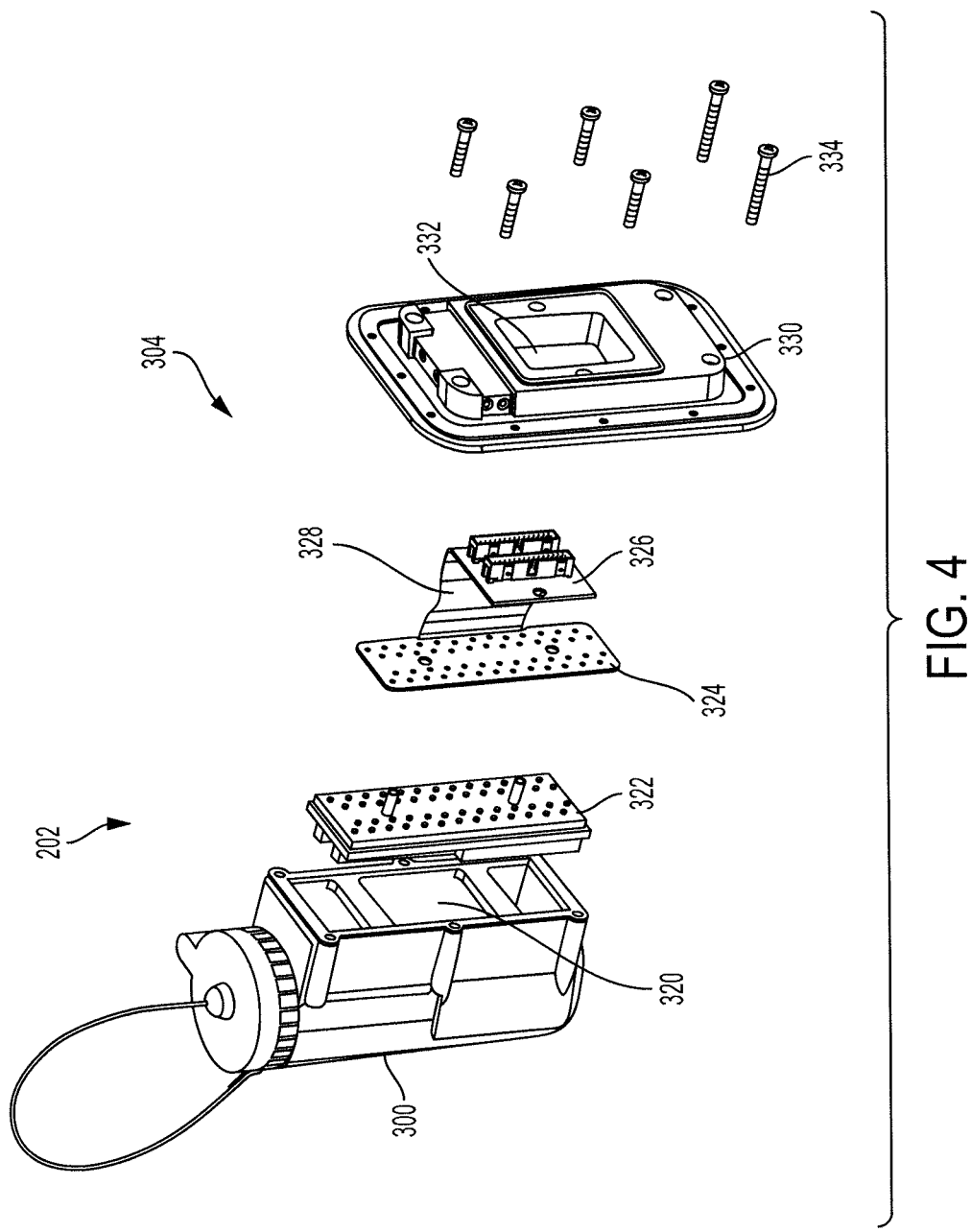
FIG. 4 is an exploded view of the pre-filter connection portion illustrating assembly of the pre-filter connection portion according to an embodiment of the present invention.

Referring to FIG. 4, various features of the main connector assembly 304 are shown. In particular, the connector casing 300 defines a cavity 320. An internal connector 322 located within the cavity 320 may be connected to the external device (not shown) on one end and to the main connector assembly 304 on the other end. The main connector assembly 304 may include a primary connection portion 324, a secondary connection portion 326, and a flexible connector portion 328. In some embodiments, the main connector assembly 304 may include a rigid/flexible circuit board. In that regard, the primary connection portion 324 and the secondary connection portion 326 may be rigid portions of the rigid/flexible circuit board and the flexible connector portion 328 may be a flexible portion of the rigid/flexible circuit board.

The internal connector 322 may provide advantages over other options. For example, the internal connector 322 may be hermaphroditic. In that regard, use of the main connector assembly 304 reduces labor required for manufacturing due to the ability to solder the primary connection portion 324 to the internal connector 322 using an automated process. The automated process is easier and less expensive than a soldering process that requires a separate solder joint and wire at each point of connection.

The pre-filter connection portion 202 further includes a face plate 330 that defines an aperture 332. The face plate 330 is designed to be fastened to the connector casing 300 via fasteners 334. In that regard, when the face plate 330 is fastened to the connector casing 300, the face plate 330 at least partially isolates the cavity 320 from an environment of the pre-filter connection portion 202.

In order to mount the main connector assembly 304 to the pre-filter connection portion 202, the secondary connection portion 326 may be extended through the aperture 332 such that the primary connection portion 324 remains on the connector casing 300 side of the face plate 330 and the secondary connection portion 326 remains on the other side of the face plate 330. In that regard, the flexible connector portion 328 may extend through the aperture 332 of the face plate 330. The primary connection portion 324 and the internal connector 322 may be fastened to the connector casing 300, and the secondary connection portion may be fastened to the face plate 330. The face plate 330 may then be fastened to the connector casing 300 to finish assembly of the pre-filter connection portion 202.

Figure 5:
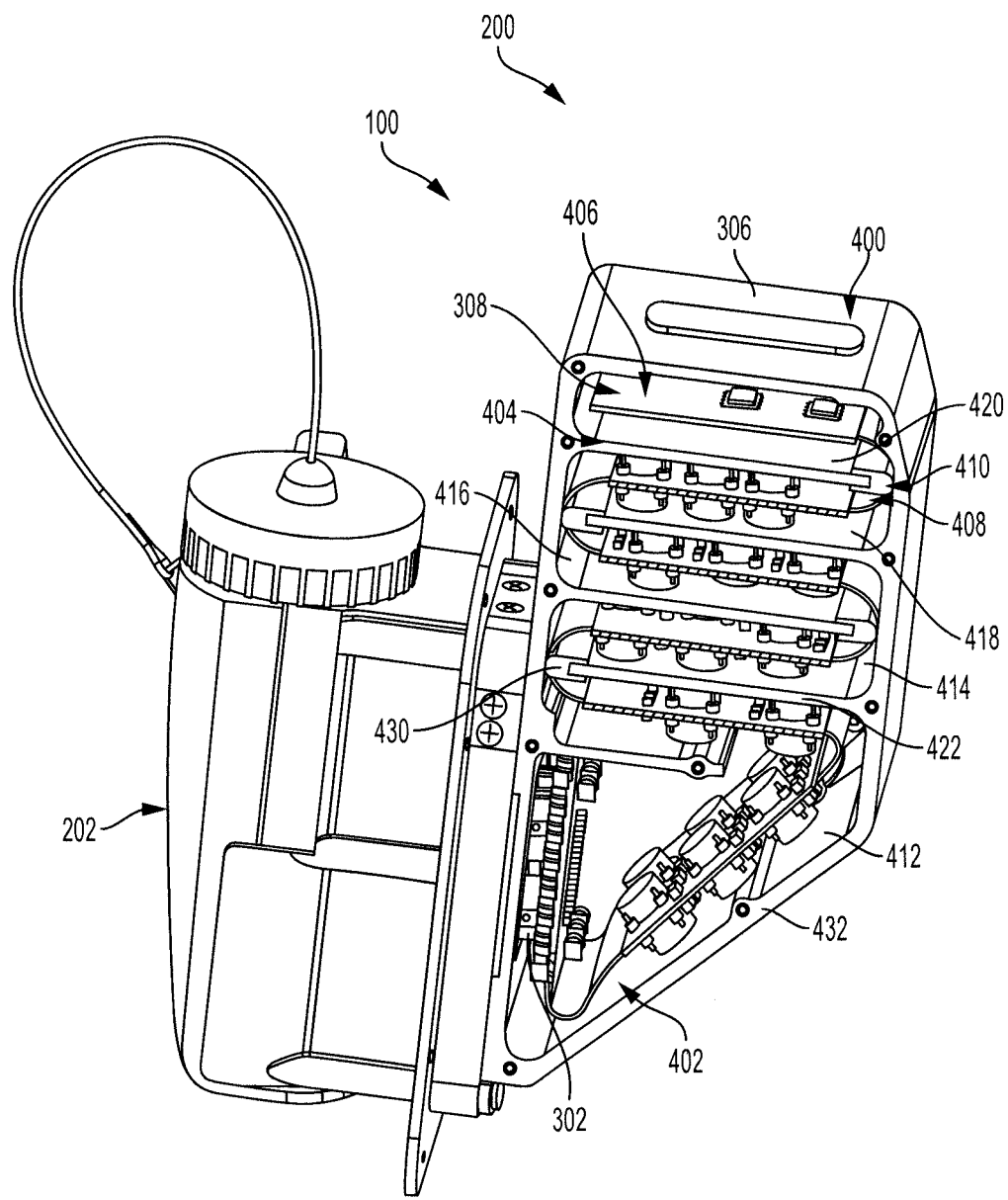
FIG. 5 is a perspective view of the filtering unit of FIG. 1 with a cover of the filtering unit removed to illustrate internal components of the filtering portion of FIG. 3 according to an embodiment of the present invention.

Turning now to FIG. 5, various internal features of the filtering portion 200 of the filtering unit 100 are shown. The housing 306 includes a plurality of outer walls 400 that define a volume 402. The housing 306 further includes a plurality of inner walls 404 that separate the volume 402 into a plurality of chambers. In a particular embodiment illustrated in FIG. 5, the housing 306 includes four inner walls 404 that separate the volume 402 into five separate chambers including a first chamber 412, a second chamber 414, a third chamber 416, a fourth chamber 418, and a fifth chamber 420.

The housing 306 may include any of a variety of materials, such as metal. In some embodiments, the housing 306 may include aluminum 6061-T6. The material of the housing 306 may be coated in some embodiments. For example, the aluminum 6061-T6 may have a chromate conversion coating, per mid-std 5541.

As shown, the rigid/flexible circuit board 308 includes multiple rigid portions 406 and multiple flexible portions 408, each positioned between a pair of rigid portions 406. In some embodiments, the entire rigid/flexible circuit board 308 may be formed at a single time. After formation, a flexible substrate may be used to insulate the flexible portions 408 and a rigid substrate may be used to insulate the rigid portions 406. In some embodiments, the flexible portions 408 may be formed with the flexible substrate and the rigid portions 406 may be formed with the rigid substrate, either simultaneously or at different times.

The rigid/flexible circuit board 308 may be positioned within the volume 402 such that at least one rigid portion 406 is positioned in each of the chambers and at least one flexible portion 408 extends around each of the inner walls 404. One or more of the rigid portions 406 may include radio frequency (RF) filtering components or other components for providing surge protection capabilities.

The filtering unit 100 may include a plurality of bumpers 410 each designed to be positioned between an outer wall 400 and one of the inner walls 404. A flexible portion 408 may extend around a corresponding bumper 410 and be compressed between the bumper 410 and one of the outer walls 400. The bumpers 410 may reduce, such as to 0 inches (0 centimeters), a size of a space between an inner wall 404 and an outer wall 400. In that regard, the inner walls 404 may be referred to as partial walls as they extend across a portion of the width of the housing 306. The bumpers 410 may then be said to effectively fill the gap between the partial walls 404 and the outer walls 400 and create an EMI seal therebetween.

Figure 6:
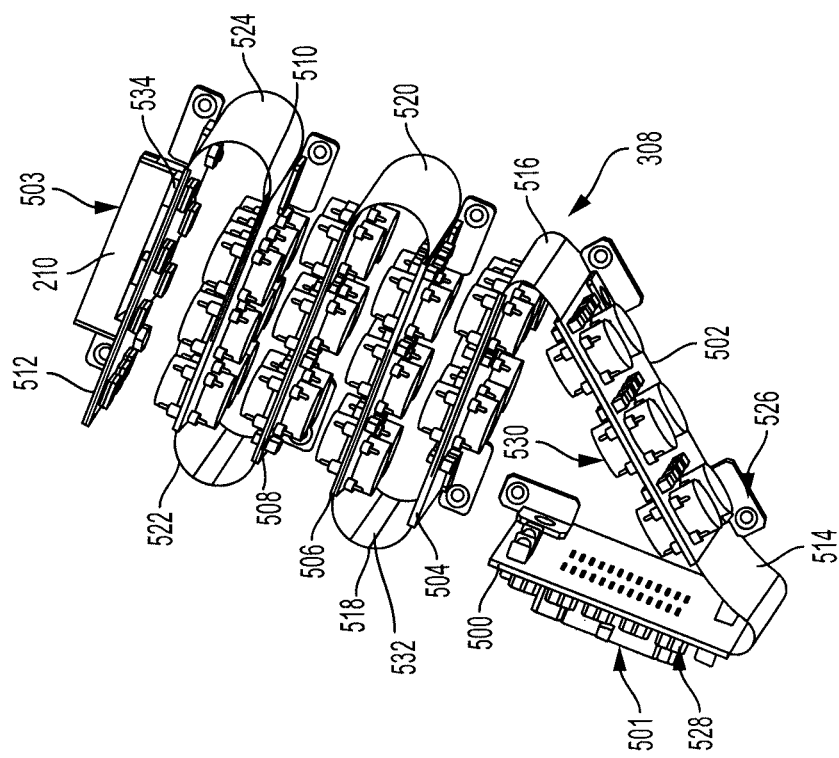
FIG. 6 is a perspective view of a rigid/flexible circuit board used in the filtering portion of FIG. 5 according to an embodiment of the present invention.

Referring now to FIGS. 5 and 6, the rigid/flexible circuit board 308 may include seven rigid portions 406 and six flexible portions 408. The rigid/flexible circuit board 308 may include an input rigid portion 500 at an input end 501. The input rigid portion 500 may include the filtering unit circuit board 302 for connecting to the pre-filter connection portion 202. An input signal may be received at the input end 501 from the filtering unit circuit board 302.

The rigid/flexible circuit board 308 may further include an output rigid portion 512 at an output end 503. The output rigid portion 512 may include the interface 210 for outputting an output signal to the ground platform 102 of FIG. 1. The output signal may be a filtered version of the input signal.

The input rigid portion 500 may further include a plurality of current limiting devices 528. The current limiting devices 528 may include, for example, gas discharge tubes, silicon-based diodes, or metal oxide varistors (MOVs). Each input line of the rigid/flexible circuit board 308 may have a corresponding current limiting device 528. Furthermore, each of the current limiting devices 528 may be positioned substantially equidistant from the corresponding input line in order to reduce variance on the signal lines.

As a surge is received by the filtering unit circuit board 302, the excess current may cause a corresponding current limiting device 528 to form a connection to ground to discharge unwanted current. In that regard, the current limiting devices 528 may function as surge protectors.

A first flexible portion 514 may connect the input rigid portion 500 to a second rigid portion 502. A second flexible portion 516 may connect the second rigid portion 502 to a third rigid portion 504. Each of the input rigid portion 500, the second rigid portion 502, the third rigid portion 504, the first flexible portion 514, and the second flexible portion 516 may be positioned within the first chamber 412. Furthermore, the second rigid portion 502 and the third rigid portion 504 may each include RF components 530 for performing filtering operations on the input signal. For example, the RF components 530 may include capacitors, inductors, or both.

A third flexible portion 518 connects the third rigid portion 504 to a fourth rigid portion 506. The fourth rigid portion 506 may be positioned within the second chamber 414. In that regard, the third flexible portion 518 may extend around a first inner wall 422. A first bumper 430 may be positioned between the first inner wall 422 and a corresponding outer wall 400. The third flexible portion 518 and the first bumper 430 may be compressed between the first inner wall 422 and the corresponding outer wall 400. In that regard, open space between the first inner wall 422 and the corresponding outer wall 400 may be minimal.

As a signal propagates from the third rigid portion 504 through the third flexible portion 518, an unwanted electric field may travel along with the signal. As the signal reaches the first bumper 430, the signal may continue to follow the signal trace that is internal to the rigid/flexible circuit board 308 to the fourth rigid portion 506. However, as the electric field reaches the first bumper 430, relatively little space exists for the unwanted electric field to propagate from the first chamber 412 to the second chamber 414. This may be due to the size of the space between the first bumper 430 and the outer walls 400 being sufficiently small to have a cutoff frequency below a frequency of the unwanted signals. In that regard, the combination of the first inner wall 422, the first bumper 430, and the corresponding outer wall 400 may function as a waveguide to limit downstream transmission of unwanted electric field. In particular, these components may function as a waveguide below cutoff, as described in U.S. Pat. No. 9,190,837, titled "Rigid Flex Electromagnetic Pulse Protection Device" and filed on May 3, 2013, the entire contents of which are hereby incorporated by reference.

In a similar manner, a fifth rigid portion 508 may be positioned in the third chamber 416, a sixth rigid portion 510 may be positioned in the fourth chamber 418, and the output rigid portion 512 may be positioned in the fifth chamber 420. Additional flexible portions 520, 522, 524 may each extend around a corresponding inner wall 404 and be compressed between the corresponding inner wall 404 and a corresponding outer wall 400 by use of a bumper 410 to provide waveguide functionality. In that regard, as the signal propagates from chamber to chamber, the amount of unwanted electrical field that travels with the signal may become further reduced.

Each of the flexible portions 408 that extend around one of the inner walls 404 may include an exposed conductive portion 532 that is designed to contact the corresponding bumper 410. Furthermore, the bumpers 410 may be conductive and be electrically coupled to the corresponding inner wall 404, which may be electrically connected to ground. The exposed conductive portion 532 of the flexible portions 408 may be electrically connected to a ground plane of the rigid/flexible circuit board 308. In that regard, contact between the exposed conductive portion 532 and the corresponding bumper 410 may create additional ground connections that further reduce an amount of electric field that is allowed to propagate from chamber to chamber.

The exposed conductive portion 532 of the flexible portions 408 may include a portion of the corresponding flexible portion 408 that was formed without an insulator. In some embodiments, the exposed portion may be the actual ground plane of the rigid/flexible circuit board 308. In some embodiments, additional conductive material may be placed on the exposed ground plane of the rigid/flexible circuit board 308. For example, the additional conductive material may include a solder pad formed on the exposed ground plane.

The bumpers 410 may include any material or combination of materials that cause the bumpers 410 to be both compliant and conductive. In some embodiments, the bumpers 410 may include a compressible material that is impregnated with metal. For example, the bumpers 410 may include silicon or ethylene propylene diene monomer (EPDM) that is impregnated with aluminum wire or another metallic substrate. In some embodiments, the bumpers 410 may include a spring device that is compressible, conductive, and capable of sealing the space between the corresponding inner wall 404 and the outer wall 400. For example, such a spring may include a Spira-Shield, available from Spira Manufacturing Corporation of San Fernando, Calif.

As described above, the second rigid portion 502 and the third rigid portion 504 include RF components 530. Similarly, the fourth rigid portion 506, the fifth rigid portion 508, and the sixth rigid portion 510 also include RF components 530. The output rigid portion 512 may include silicon based voltage suppression devices 534. The silicon based voltage suppression devices 534 may perform additional filtering and may limit a maximum output voltage. For example, the silicon based voltage suppression devices 534 may include bipolar Zener or silicon avalanche diodes, ethernet lightening protectors, or varistors.

Figure 7:
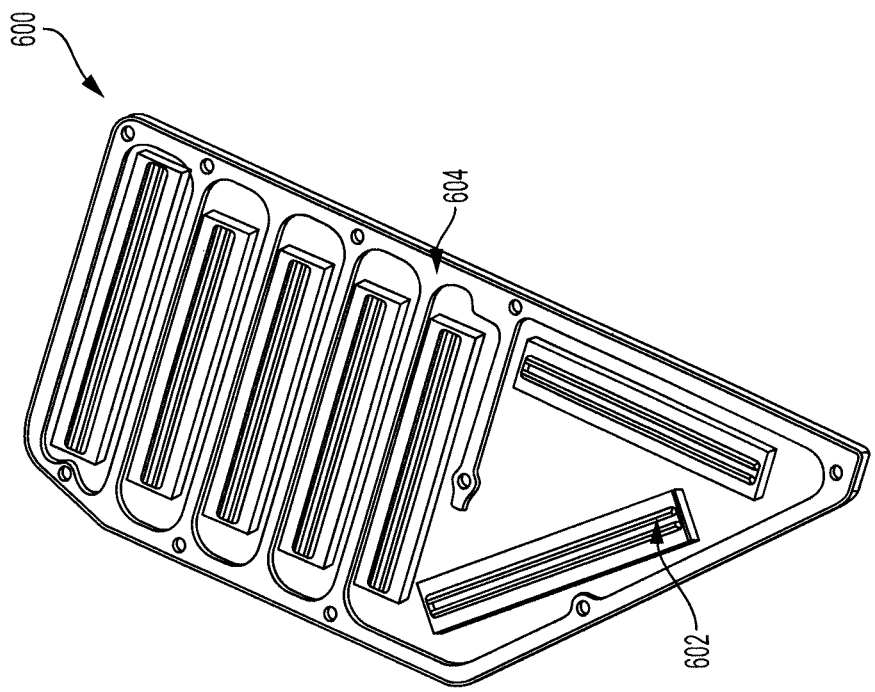
FIG. 7 is a perspective view of the cover of the filtering unit of FIG. 5 according to an embodiment of the present invention.

Referring now to FIGS. 5, 6, and 7, the portion of the housing 306 shown in FIG. 5 may be a single integral component. A cover 600 is designed to be fastened to an exposed face 432 of the outer walls 400. When the cover 600 is fastened to the exposed face 432, the volume 402 defined by the outer walls 400 may be sealed from the environment. The cover 600 may include similar or the same material as the housing 306.

Multiple mounting tabs 526 may be coupled to the rigid portions 406 of the rigid/flexible circuit board 308. In that regard, the rigid/flexible circuit board 308 may be positioned within the volume 402 as shown in FIG. 5. Fasteners (not shown) may then be used to fasten the mounting tabs 526 to the housing 306.

The cover 600 may include various features to improve functionality of the filtering unit 100. In particular, the cover 600 includes multiple vibration isolation dampers 602. Each of the vibration isolation dampers 602 is designed to mate with a corresponding rigid portion 406 of the rigid/flexible circuit board 308 when the cover 600 is attached to the rest of the housing 306.

The vibration isolation dampers 602 may include any material capable of dampening vibrations. For example, the dampers 602 may include silicon, rubber, foam, or the like. With brief reference to FIG. 8, the vibration isolation damper 602 may have a first prong 606 and a second prong 608 that define a space 610 therebetween. As the cover 600 is positioned on the rest of the housing 306, the rigid portion 502 may be received by the space 610 of the corresponding vibration isolation damper 602. In that regard, the vibration isolation damper 602 reduces the likelihood of the rigid portion 502 moving relative to the housing 306. In some embodiments, the rigid portion 502 may fit snugly between the first prong 606 and the second prong 608.

In some embodiments, the vibration isolation damper 602 may be conductive. This may provide further shielding of the desired signal from external electric fields. This may be accomplished by contact between the vibration isolation damper 602 and an exposed portion of the ground plane on the rigid portion 502.

Figure 8:
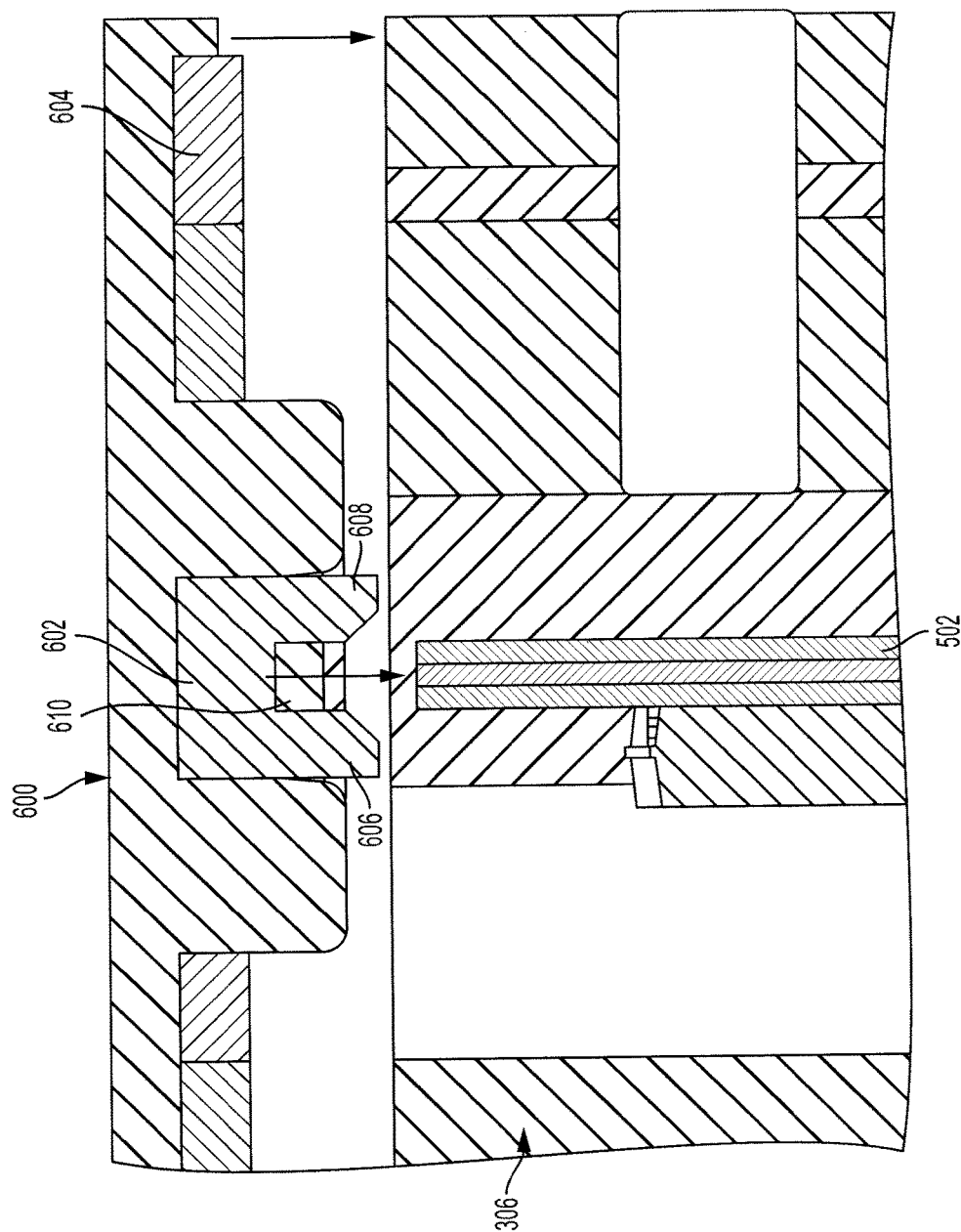
FIG. 8 is a cross-sectional view of the filtering unit illustrating interaction between the cover of FIG. 7 and a remainder of a housing of the filtering unit according to an embodiment of the present invention.

Referring to FIGS. 5, 7, and 8, the cover 600 may further include a gasket 604. In some embodiments, the gasket 604 may be conductive. In some embodiments, the gasket 604 may be compressible. In some embodiments, the gasket 604 may include the same material or materials as the bumpers 410. In that regard, the gasket 604 may provide weather sealing for the housing 306 and may provide an electrical connection between the cover 600 and the rest of the housing 306 in order to maintain a ground connection between the cover 600 and the remainder of the housing 306.

The gasket 604 may include portions that align with each of the outer walls 400 and each of the inner walls 404 of the remainder of the housing 306. In that regard, when the cover 600 is attached to the housing 306, the gasket may contact the outer exposed face 432 of each of the walls 400, 404.

Figure 9:
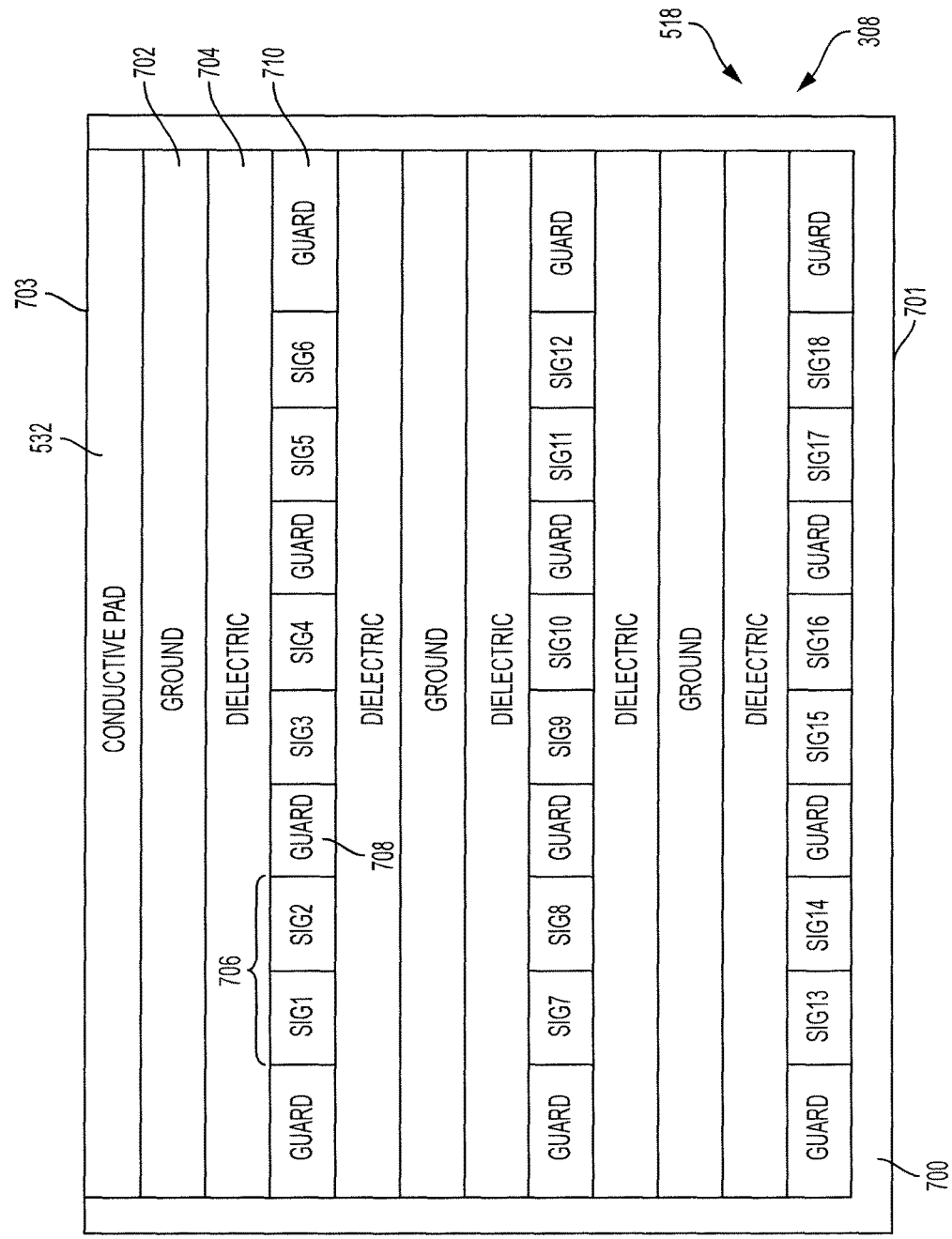
FIG. 9 is a cross-sectional view of a flexible portion of the rigid/flexible circuit board of FIG. 6 according to an embodiment of the present invention.

Referring to FIGS. 5 and 9, a cross-sectional view of the third flexible portion 518 of the rigid/flexible circuit board 308 is shown. In particular, the third flexible portion 518 includes an outer side 701 that makes contact with the outer wall 400 of the housing 306. The third flexible portion 518 further includes an inner side 703 designed to make contact with the first bumper 430. The components of the third flexible portion 518 may be housed within a flexible insulator 700 with the exception of the exposed portion 532. Each of the flexible portions 408 may include a similar exposed portion of the ground plane or layer.

The inner side 703 of the third flexible portion 518 includes the exposed portion 532 of the rigid/flexible circuit board 308. Stated differently, the exposed portion 532 of each of the flexible portions 408 may be located on the interior of the radius of the bend of each of the flexible portions 408. As shown in FIG. 9, the exposed portion 532 may include a conductive pad such as a tin solder pad. In some embodiments, the outer side 701 may also include an exposed portion electrically coupled to ground and designed to contact the outer wall 400 of the housing 306 instead of or in addition to the exposed portion 532.

A ground plane 702 may be positioned adjacent to the exposed portion 532 and be electrically connected to the exposed portion 532. In that regard, the exposed portion 532 is electrically connected to the ground plane 702.

A dielectric material 704 may be positioned between the ground plane 702 and a signal plane 710. The dielectric material 704 may function as an insulator between circuit layers of the rigid/flexible circuit board 308.

The signal plane 710 may include multiple differential signal pairs 706 and multiple guard traces 708. The guard traces 708 may isolate or insulate each of the differential signal pairs 706.

The above layers may then be repeated to include as many differential signal pairs 706 as desired. Dielectric material 704 may be positioned adjacent to each of the signal planes 710, and a ground plane 702 may be positioned between the different layers of dielectric material 704.

Figure 10:
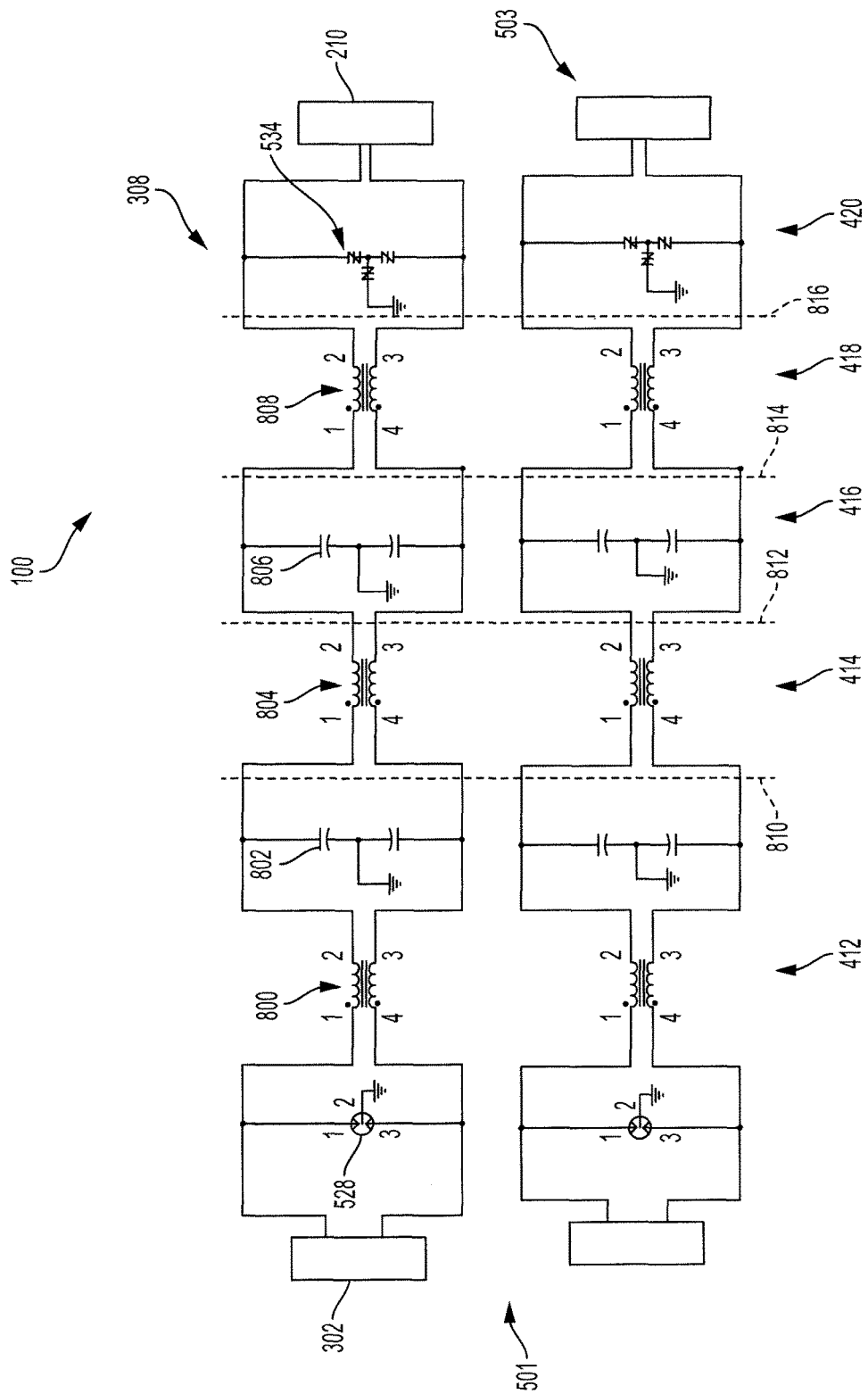
FIG. 10 is a schematic drawing illustrating various components of the rigid/flexible circuit board of FIG. 6 according to an embodiment of the present invention.

Referring to FIG. 10, an exemplary schematic layout of the rigid/flexible circuit board 308 is shown. The left hand side of FIG. 10 corresponds to the input end 501 and the right hand, side of FIG. 10 corresponds to the output end 503. As shown, the filtering unit circuit board 302 receives an input signal at the input end 501 within the first chamber 412. The input signal may then be received by one or more current limiting device 528 that functions as a surge protector to divert surge power to ground.

After traveling beyond the current limiting device 528, the signal may then be received by one or more first inductor 800 and one or more first capacitor 802. The one or more first inductor 800 and the one or more first capacitor 802 may perform radio frequency filtering of the signal.

The signal may then travel through a first waveguide 810 corresponding to the location of the first bumper 430 of FIG. 5 where the third flexible portion 518 of FIG. 6 is compressed between the first inner wall 422 and the outer wall 400. The waveguide 810 may further reduce unwanted signals (such as noise) on the signal path.

After traveling through the first waveguide 810, the signal may travel through one or more second inductor within the second chamber 414. The one or more second inductor may further perform radio frequency filtering of the signal. The signal may then travel through the second waveguide 812 where it may be received in the third chamber 416.

The third chamber may include one or more second capacitor 806 for additional radio frequency filtering. After the filtering by the one or more second capacitor 806, the signal may travel through the third waveguide 814 into the fourth chamber 418. The fourth chamber may include one or more third inductor for additional radio frequency filtering. In some embodiments, the inductors could be replaced with some other filtering device or a current limiting device such as a resettable fuse or a Transient Blocking Unit (TBU®), available from Bourns® of Riverside, Calif.

From the fourth chamber 418, the signal may travel through the fourth waveguide 816 into the fifth, or final, chamber 420. The fifth chamber 420 may include the silicon based suppression devices 534 for providing additional signal filtering and surge protection. From the silicon based suppression devices 534, the signal may travel out of the filtering unit 100 via the interface 210 as a clean signal.

In some embodiments, the filtering unit 100 may filter unwanted signals having frequencies above 100 kilohertz (kHz) for input signals having frequencies up to 15 kHz. In some embodiments, the filtering unit 100 may filter unwanted signals having frequencies above 1 megahertz (MHz) for input signals having frequencies up to 550 kHz. One skilled in the art will realize that the filtering unit 100 may handle various frequencies, based on the environment in which the filtering unit 100 is used, without departing from the scope of the present disclosure.

Where used herein, "at least one of A or B" includes any of "A only," "B only," and "A and B," where "A" and "B" represent any included element herein. Exemplary embodiments of the methods/systems have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. A filtering unit for filtering unwanted signals from a desired signal comprising:
   a housing having outer walls that define a volume and an inner wall that separates the volume into a first chamber and a second chamber;
   a rigid/flexible circuit board having:
      a first rigid portion configured to be positioned in the first chamber,
      a second rigid portion configured to be positioned in the second chamber, and
      a flexible portion connecting the first rigid portion to the second rigid portion and configured to extend around the inner wall from the first chamber to the second chamber; and
   a bumper configured to be positioned between one of the outer walls and the inner wall and to contact the flexible portion of the rigid/flexible circuit board in order to reduce a size of a space between the one of the outer walls and the inner wall in order to provide waveguide functionality by reducing an amount of electric field that can pass from the first chamber to the second chamber.

2. The filtering unit of claim 1 further comprising four bumpers including the bumper, wherein:
   the housing includes four inner walls including the inner wall that separate the housing into five chambers including the first and second chambers;
   the rigid/flexible circuit board includes multiple rigid portions including the first and second rigid portions such that at least one rigid portion is configured to be positioned in each of the five chambers, and includes multiple flexible portions at least two of which are configured to extend around a corresponding inner wall; and
   each of the four bumpers are configured to be positioned between the outer walls and the corresponding inner wall in order to provide the waveguide functionality by progressively reducing the amount of electric field that can pass between each of the five chambers.

3. The filtering unit of claim 2 wherein:
   the rigid/flexible circuit board has an input end configured to receive an input signal and an output end configured to output a filtered version of the input signal;
   the multiple rigid portions include an input rigid portion configured to receive the input signal and an output rigid portion configured to output the filtered version of the input signal;
   the input rigid portion includes at least one of a gas discharge tube, a silicon-based diode, or a metal oxide varistor configured to limit an amount of current that reaches downstream rigid portions; and
   the output rigid portion includes a silicon based voltage suppressor configured to limit a voltage of the filtered version of the input signal.

4. The filtering unit of claim 1 wherein at least one of the first rigid portion or the second rigid portion includes at least one of a capacitor or an inductor configured to reduce signal noise.

5. The filtering unit of claim 1 wherein:
   the housing includes a cover configured to be attached to at least one of the outer walls to isolate the volume from an environment of the filtering unit;
   the cover includes a first vibration isolation damper configured to be positioned adjacent to the first rigid portion to resist movement of the first rigid portion relative to the housing and to reduce vibration experienced by the first rigid portion, and a second vibration isolation damper configured to be positioned adjacent to the second rigid portion to resist movement of the second rigid portion relative to the housing and to reduce vibration experienced by the second rigid portion; and the cover includes a gasket positioned near a periphery of the cover and configured to contact the at least one of the outer walls to seal the volume from the environment.

6. The filtering unit of claim 1 further comprising a pre-filter connection portion configured to provide an input signal to the rigid/flexible circuit board and having:
a connector casing defining a cavity and configured to be positioned outside of the housing and to be connected to the housing;
an internal connector configured to be positioned in the cavity;
a main connector assembly having a primary connection portion configured to be positioned in the cavity and soldered to the internal connector, a secondary connection portion configured to mate with a filtering unit circuit board of the rigid/flexible circuit board, and a flexible connector portion connecting the primary connection portion to the secondary connection portion; and
a face plate configured to be coupled to the connector casing to at least partially isolate the cavity from an environment of the connector casing and defining an aperture configured to receive the flexible connector portion such that the flexible connector portion extends through the aperture and the secondary connection portion is positioned outside of the cavity.

7. The filtering unit of claim 1 wherein the bumper includes at least one of silicon or ethylene propylene diene monomer to provide sealing properties and is impregnated with a metal to provide conductive properties.

8. The filtering unit of claim 1 wherein:
the rigid/flexible circuit board further includes a ground plane;
the flexible portion includes an exposed conductive portion electrically connected to the ground plane; and
the bumper is conductive and configured to make contact with the exposed conductive portion of the flexible portion to create an electrical connection between the ground plane and the housing.

9. A filtering unit for filtering unwanted signals from a desired signal comprising:
a housing having outer walls that define a volume and an inner wall that separates the volume into a first chamber and a second chamber;
a rigid/flexible circuit board having:
a ground plane,
a first rigid portion configured to be positioned in the first chamber,
a second rigid portion configured to be positioned in the second chamber, and
a flexible portion connecting the first rigid portion to the second rigid portion, having an exposed conductive portion electrically connected to the ground plane, and configured to extend around the inner wall from the first chamber to the second chamber; and
a conductive bumper configured to be positioned between one of the outer walls and the inner wall and to make contact with the exposed conductive portion of the flexible portion to create an electrical connection between the ground plane and the housing.

10. The filtering unit of claim 9 further comprising four conductive bumpers including the conductive bumper, wherein:
the housing includes four inner walls including the inner wall that separate the housing into five chambers including the first and second chambers;
the rigid/flexible circuit board includes multiple rigid portions including the first and second rigid portions such that at least one rigid portion is configured to be positioned in each of the five chambers, and includes multiple flexible portions at least two of which having the exposed conductive portion and configured to extend around a corresponding inner wall; and
each of the four conductive bumpers are configured to be positioned between the outer walls and the corresponding inner wall and to make contact with the exposed conductive portion of a corresponding flexible portion to create multiple electrical connections between the ground plane and the housing.

11. The filtering unit of claim 10 wherein:
the rigid/flexible circuit board has an input end configured to receive an input signal and an output end configured to output a filtered version of the input signal;
the multiple rigid portions include an input rigid portion configured to receive the input signal and an output rigid portion configured to output the filtered version of the input signal;
the input rigid portion includes at least one of a gas discharge tube, a silicon-based diode, or a metal oxide varistor configured to limit an amount of current that reaches downstream rigid portions; and
the output rigid portion includes a silicon based voltage suppressor configured to limit a voltage of the filtered version of the input signal.

12. The filtering unit of claim 9 wherein at least one of the first rigid portion or the second rigid portion includes at least one of a capacitor or an inductor configured to reduce signal noise.

13. The filtering unit of claim 9 wherein:
the housing includes a cover configured to be attached to at least one of the outer walls to isolate the volume from an environment of the filtering unit;
the cover includes a first vibration isolation damper configured to be positioned adjacent to the first rigid portion to resist movement of the first rigid portion relative to the housing and to reduce vibration experienced by the first rigid portion, and a second vibration isolation damper configured to be positioned adjacent to the second rigid portion to resist movement of the second rigid portion relative to the housing and to reduce vibration experienced by the second rigid portion; and
the cover includes a gasket positioned near a periphery of the cover and configured to contact the at least one of the outer walls to seal the volume from the environment.

14. The filtering unit of claim 9 further comprising a pre-filter connection portion configured to provide an input signal to the rigid/flexible circuit board and having:
a connector casing defining a cavity and configured to be positioned outside of the housing and to be connected to the housing;
an internal connector configured to be positioned in the cavity;
a main connector assembly having a primary connection portion configured to be positioned in the cavity and soldered to the internal connector, a secondary connection portion configured to mate with a filtering unit circuit board of the rigid/flexible circuit board, and a flexible connector portion connecting the primary connection portion to the secondary connection portion; and a face plate configured to be coupled to the connector casing to at least partially isolate the cavity from an environment of the connector casing and defining an aperture configured to receive the flexible connector portion such that the flexible connector portion extends through the aperture and the secondary connection portion is positioned outside of the cavity.

15. The filtering unit of claim 9 wherein the conductive bumper includes at least one of silicon or ethylene propylene diene monomer to provide sealing properties and is impregnated with a metal to provide conductive properties.

16. The filtering unit of claim 9 wherein the conductive bumper is compressed between the one of the outer walls and the inner wall in order to reduce a size of a space between the one of the outer walls and the inner wall in order to provide waveguide functionality by reducing an amount of electric field that can pass from the first chamber to the second chamber.

17. A filtering unit for filtering unwanted signals from a desired signal comprising:
    a housing having outer walls that define a volume, four inner walls that separate the housing into five chambers, and a cover configured to be attached to at least one of the outer walls to isolate the volume from an environment of the filtering unit;
    a rigid/flexible circuit board having:
        at least five rigid portions each configured to be positioned in one of the five chambers, and
        multiple flexible portions each positioned between two of the at least five rigid portions such that at least at least one flexible portion extends around each of the four inner walls; and
    four bumpers each configured to be positioned between one of the outer walls and a corresponding inner wall in order to reduce a size of a space between the one of the outer walls and the corresponding inner wall in order to provide waveguide functionality by progressively reducing an amount of electric field that can pass between each of the five chambers, wherein the cover includes:
    multiple isolation dampers each configured to be positioned adjacent to one of the at least five rigid portions to resist movement of a corresponding rigid portion relative to the housing and to reduce vibration experienced by the corresponding rigid portion, and
    a gasket positioned near a periphery of the cover and configured to contact the at least one of the outer walls to seal the volume from the environment.

18. The filtering unit of claim 17 wherein:
the rigid/flexible circuit board further includes a ground plane;
at least some of the multiple flexible portions includes an exposed conductive portion electrically connected to the ground plane; and
each of the four bumpers are conductive and configured to make contact with the exposed conductive portion of a corresponding flexible portion to create an electrical connection between the ground plane and the housing.

19. The filtering unit of claim 17 further comprising a pre-filter connection portion configured to provide an input signal to the rigid/flexible circuit board and having:
    a connector casing defining a cavity and configured to be positioned outside of the housing and to be connected to the housing;
    an internal connector configured to be positioned in the cavity;
    a main connector assembly having a primary connection portion configured to be positioned in the cavity and soldered to the internal connector, a secondary connection portion configured to mate with a filtering unit circuit board of the rigid/flexible circuit board, and a flexible connector portion connecting the primary connection portion to the secondary connection portion; and
    a face plate configured to be coupled to the connector casing to at least partially isolate the cavity from an environment of the connector casing and defining an aperture configured to receive the flexible connector portion such that the flexible connector portion extends through the aperture and the secondary connection portion is positioned outside of the cavity.

* * * * *